US009508425B2

(12) United States Patent
Lu et al.

(10) Patent No.: US 9,508,425 B2
(45) Date of Patent: Nov. 29, 2016

(54) NANOSCALE METAL OXIDE RESISTIVE SWITCHING ELEMENT

(75) Inventors: Wei Lu, Ann Arbor, MI (US); Sung Hyun Jo, Sunnyvale, CA (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 742 days.

(21) Appl. No.: 13/167,920

(22) Filed: Jun. 24, 2011

(65) Prior Publication Data

US 2012/0001146 A1   Jan. 5, 2012

Related U.S. Application Data

(60) Provisional application No. 61/358,385, filed on Jun. 24, 2010, provisional application No. 61/359,818, filed on Jun. 29, 2010.

(51) Int. Cl.
*H01L 47/00*   (2006.01)
*G11C 11/56*   (2006.01)
*G11C 13/00*   (2006.01)
(Continued)

(52) U.S. Cl.
CPC ....... *G11C 11/5685* (2013.01); *G11C 13/0007* (2013.01); *H01L 27/2436* (2013.01); *H01L 27/2472* (2013.01); *H01L 45/08* (2013.01); *H01L 45/1233* (2013.01); *H01L 45/146* (2013.01); *H01L 45/1633* (2013.01); *H01L 45/1675* (2013.01)

(58) Field of Classification Search
CPC ....................... G11C 11/5685; G11C 13/0007
USPC ............................................ 257/4, E21.003
See application file for complete search history.

(56) References Cited

U.S. PATENT DOCUMENTS

2004/0235200 A1*   11/2004   Hsu ................... G11C 13/0007
                                                                                438/3
2008/0232160 A1*    9/2008   Gopalakrishnan ............ 365/163
(Continued)

OTHER PUBLICATIONS

K. Miyake, H. Kaneko, M. Sano, N. Suedomi, "Physical and electrochromic properties of the amorphous and crystalline tungsten oxide thick films prepared under reducing atmosphere," J. Appl. Phys. 55, 2747-2753, 1984.
(Continued)

*Primary Examiner* — Wael Fahmy
*Assistant Examiner* — Sarah Salerno
(74) *Attorney, Agent, or Firm* — Amin, Turocy & Watson, LLP

(57) ABSTRACT

A non-volatile memory device structure. The non-volatile memory device structure comprises a first electrode formed from a first metal material, a resistive switching element overlying the first electrode. The resistive switching element comprises a metal oxide material characterized by one or more oxygen deficient sites. The device includes a second electrode overlying the resistive switching layer, the second electrode being formed from a second metal material. The second electrode is made from a noble metal. The one or more oxygen deficient sites are caused to migrate from one of the first electrode or the second electrode towards the other electrode upon a voltage applied to the first electrode or the second electrode. The device can have a continuous change in resistance upon applying a continuous voltage ramp, suitable for an analog device. Alternatively, the device can have a sharp change in resistance upon applying the continuous voltage ramp, suitable for a digital device.

48 Claims, 13 Drawing Sheets

(51) Int. Cl.
  H01L 27/24    (2006.01)
  H01L 45/00    (2006.01)

(56) References Cited

U.S. PATENT DOCUMENTS

2009/0152526 A1* 6/2009 Courtade et al. ............... 257/4
2010/0007937 A1* 1/2010 Widjaja et al. ............... 359/265

OTHER PUBLICATIONS

E. Ozkan, S.-H. Lee, C. E. Tracy, J. R. Pitts, S. K. Deb, "Comparison of electrochromic amorphous and crystalline tungsten oxide films," Solar Energy Mater. Solar Cells 79, 439-448, 2003.

C. O. Avellaneda, L. O. S. Bulhoes, "Intercalation in WO3 and WO3:Li films," Solid State Ionics. 165, 59-64, 2003.

A. Antonaia, M. C. Santoro, G. Fameli, T. Polichetti, "Transport mechanism and IR structural characterization of evaporated amorphous WO3 films," Thin Solid Films 426, 281-287, 2003.

M. Gillet, K. Aguir, C. Lemire, E. Gillet, K. Schierbaum, "The structure and electrical conductivity of vacuum-annealed WO3 thin films," Thin Solid Films 467, 239-246, 2004.

C. Bechinger, S. Herminghaus, P. Leiderer, "Photoinduced doping of thin amorphous WO3 films," Thin Solid Films 239, 156-160, 1994.

R. C. Agrawal, M. L. Verma, R. K. Gupta, "Electrical and electrochemical properties of a new silver tungstate glass system: x[0.75AgI: 0.25AgCl]: (1-x)[Ag2O: WO3]," Solid State Ionics 171, 199-205, 2004.

A. Monteiro, M. F. Costa, B. Almeida, V. Teixeira, J. Gago, E. Roman, "Structural and optical characterization of WO3 deposited on glass and ITO," Vacuum 64, 287-291, 2002.

L. Lozzi, L. Ottaviano, H. Passacantando, S. Santucci, C. Cantalini, "The influence of air and vacuum thermal treatments on the NO2 gas sensitivity of WO3 thin films prepared by thermal evaporation," Thin Solid Films 391, 224-228, 2001.

A.D. Kuypers, C.I.M.A. Spee, J.L. Linden, G. Kirchner, J.F. Forsyth, A. Mackor, "Plasma-enhanced CVD of electrochromic materials," Surf. Coat. Tech. 74/75, 1033-1037, 1995.

M. Tong, G. Dai, D. Gao, "WO3 thin film sensor prepared by sol-gel technique and its low-temperature sensing properties to trimethylamine," Mater. Chem. Phys. 69, 176-179, 2001.

M. Regragui, V. Jousseaume, M. Addou, A. Outzourhit, J.C. Bernéde, B. El Idrissi, "Electrical and optical properties of WO3 thin films," Thin Solid Films 397, 238-243, 2001.

C. Kügeler et al., "Fast resistive switching in WO3 thin films for nonvolatile memory applications," 9th IEEE Conference on Nanotechnology 2009, 901-903, 2009.

M. N. Kozicki, C. Gopalan, M. Alakrishnan, M. Mitkova, "A Low-Power Nonvolatile Switching Element Based on Copper-Tungsten Oxide Solid Electrolyte," IEEE Trans. Nanotechnol. 5, 535, 2006.

C. Ho E. K. Lai, M. D. Lee, C. L. Pan, Y. D. Yao, K. Y. Hsieh, R. Liu, C. Y. Lu, "A Highly Reliable Self-Aligned Graded Oxide WOx Resistance Memory: Conduction nMechanisms and Reliability," IEEE VLSI Tech. Digest 228, 2007.

R. Sohal, C. Walczyk, P. Zaumseil, D. Wolansky, A. Fox, B. Tillack, H.-J. Müssig, T. Schroeder, "Thermal oxidation of chemical vapour deposited tungsten layers on silicon substrates for embedded nonvolatile memory application," Thin Solid Films 517, 4534-4539, 2009.

C. Bittencourt, R. Landers, E. Llobet, X. Correig, J. Calderer, "The role of oxygen partial pressure and annealing temperature on the formation of W=O bonds in thin WO3 films," Semicond. Sci. Technol. 17, 522, 2002.

T. Karakasidis, M. Meyer, "Grain-boundary diffusion of cation vacancies in nickel oxide:mA molecular-dynamics study," Phys. Rev. B. 55, 13853-13864, 1997.

M.-J. Lee, S. Han, S. H. Jeon, B. H. Park, B. S. Kang et al., "Electrical Manipulation of Nanofilaments in Transition-Metal Oxides for Resistance-Based Memory," Memory, Nano Lett. 9, 1476-1481, 2009.

* cited by examiner

NANOSCALE METAL OXIDE RESISTIVE SWITCHING ELEMENT

CROSS-REFERENCE TO RELATED APPLICATIONS

This application claims the benefit of U.S. Provisional Application No. 61/358,385, filed Jun. 24, 2010, and U.S. Provisional Application No. 61/359,818, filed Jun. 29, 2010. The entire contents of these two applications are hereby incorporated by reference.

STATEMENT RELATED TO FEDERAL FUNDING

This invention was made with government support under CCF0621823 awarded by the National Science Foundation. The government has certain rights in the invention.

BACKGROUND OF THE INVENTION

The present invention generally relates to non-volatile switching and memory devices. More particularly, the present invention in some embodiments provides a structure and a method of forming resistive switching non-volatile memory devices using a metal oxide as a switching element.

Memory devices are usually transistor based. Current memory devices shrink is primarily driven by a scale down of the transistor. Recent developments in other memory device structures, such as ferroelectric RAM (Fe RAM), magneto-resistive RAM (MRAM), organic RAM (ORAM), and phase change RAM (PCRAM) are limited by a lack of one or more attributes to high density and high speed memory devices. For example, Fe-RAM and MRAM are fast switching and having high programming endurance, they are however, not compatible to CMOS processing. The device size is too large and limited in further device size shrink. PCRAM uses Joule heating for resistivity switching and therefore incurs an increase in power consumption. Additionally, PCRAM is also limited by uniformity in phase change control when the device is scaled down. ORAM suffers from incompatibility with present CMOS processing as well as device reliability and low device yield.

From the above, scalable memory devices and device structures compatible with present CMOS process technology are desirable.

SUMMARY OF THE INVENTION

The present invention is directed to switching and memory devices. More particularly, the present invention in at least some embodiments provides a structure and a method of forming a resistive switching non-volatile memory device using a metal oxide as a switching element. The illustrated embodiment of the present invention has been exemplified using a tungsten oxide material as a switching material. But it should be recognize that other metal oxide materials may also be used and other embodiments of the present invention may have a much broader range of applicability.

In a specific embodiment, a switching device structure is provided. The switching device includes a first electrode. The first electrode includes a first conductor material. The first conductor material can be a metal material including tungsten in a specific embodiment. The switching device includes a resistive switching element overlying the first electrode. In a specific embodiment, the resistive switching element uses a metal oxide material characterized by one or more oxygen deficient sites or metal deficient sites. The metal oxide material includes a tungsten oxide material in a specific embodiment. A second electrode overlies the resistive switching element. The second electrode includes a second metal material. The second metal material can be a noble metal in a specific embodiment. Depending on the embodiment, the switching device may be operably coupled to a MOS device by way of the first electrode or the second electrode with an interconnect element of the MOS device.

In a specific embodiment, a method of forming a switching device is provided. The method includes providing a semiconductor substrate. The semiconductor substrate can be a silicon wafer having one or more MOS devices formed thereon. The method includes forming a first dielectric material overlying a surface region of the semiconductor substrate. A first electrode structure is formed overlying the dielectric material. In a specific embodiment, the first electrode structure is formed using a first metal material. The first metal material is a tungsten material in a specific embodiment. The tungsten material may be formed using a chemical vapor deposition or physical deposition process depending on the application. The method forms a resistive switching element overlying the first electrode structure. In a specific embodiment, the resistive switching element includes a metal oxide material characterized by one or more oxygen deficient sites. A second electrode structure formed from a second metal material is formed overlying the resistive switching layer. Depending on the application, the second material can be formed from a noble metal such as gold, platinum, palladium, and the like.

Many benefits can be achieved by way of the disclosed embodiments of the invention. For example, there is provided a method and a structure to form a switching device, which can be used in a scalable non-volatile memory device in a specific embodiment. Moreover, the present method and device structure can use a low temperature process for electrode formation and provides for a flexible thermal budget for device fabrication. The present device fabrication uses process and materials that are compatible with CMOS processing. Additionally, the present device allows for low current for programming and further reduces power consumption in operation. Additionally, the present device allows for a continuous change in the device resistance (suitable as analog devices) or a sharp change in the device resistance (suitable as digital devices). Depending on the embodiment, one or more benefits may be achieved. One skilled in the art would recognize other variations, modifications, and alternatives.

DETAILED DESCRIPTION OF THE PREFERRED EMBODIMENTS

Resistive switching for memory devices usually includes a change of an electric resistance of a switching element sandwiched between two electrodes. The change of the electric resistance of the switching device can be brought about by an injection or redistribution of conductive entities into the switching element when a voltage or a current is applied to the electrodes. Depending on the device structure, the resistance of the switching element may be changed by using mechanisms such as conductor particles formation, electrochemical reactions or cation/anion migration or even oxygen migration in the switching medium, and others, depending on the application.

Accordingly, the illustrated embodiments are related to switching devices. More particularly, the illustrated embodiments provide a structure and a method for forming a resistive switching device using a metal oxide as a switching material. The switching device has been used in a non-volatile memory device, but other embodiments can have a much broader range of applicability.

In a specific embodiment, the metal oxide includes a tungsten oxide material. Tungsten has been used in interconnects in back end process for MOS device fabrication. Therefore the use of tungsten and its oxides can be integrated into current MOS process technology and equipments for processing. Additionally, tungsten can be deposited using relatively low temperature processes such as sputtering and chemical vapor deposition process allowing for flexible process integrations.

Figure 1:
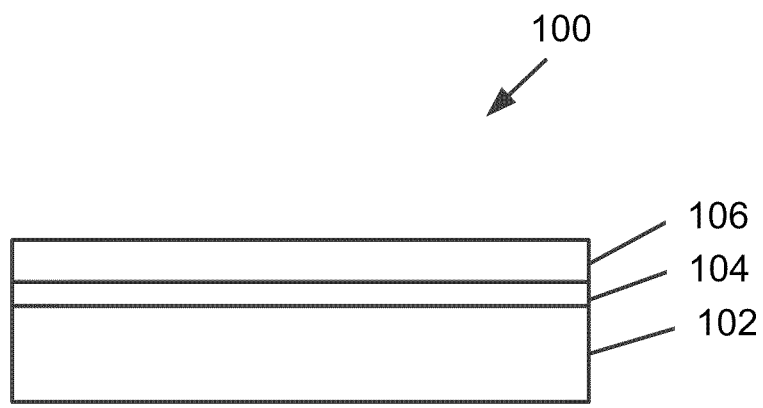
FIG. 1 is a simplified diagram illustrating a metal oxide resistive switching device according to an embodiment of the present invention.

FIG. 1 is a simplified diagram illustrating a switching device structure 100 according to an embodiment of the present invention. As shown, the switching device includes a first electrode 102. The first electrode can be a metal material in a specific embodiment. The metal material may include gold, platinum, palladium, aluminum, silver, tungsten, any combination of these including their respective alloys, among others. In an alternative embodiment, the first electrode can be a semiconductor material doped with a suitable impurity species. In a specific embodiment, the first electrode can have a width in nanometer range, for example, between about 5 nanometers to about 100 nanometers.

In a specific embodiment, the first electrode includes a tungsten material. The tungsten material can be formed as a tungsten metal. The tungsten material can also be a tungsten thin film formed on a noble metal, or others, depending on the application. The tungsten metal or thin film may be formed using physical vapor deposition such as sputtering or evaporation from a tungsten target. Depending on the embodiment, the tungsten material can have a thickness ranging from about 50 nm to about 100 nm to provide for a nano-scale first electrode structure. The tungsten material or the tungsten thin film material can also be deposited using a chemical vapor deposition technique using tungsten hexafluoride ($WF_6$) and a suitable reducing species such as hydrogen in a specific embodiment. Deposition temperature is usually kept at about 250 Degree Celsius to about 500 Degree Celsius and in some embodiments may range upwardly from about 340 Degree Celsius and in other embodiments can be at about 350 Degree Celsius.

In a specific embodiment, the switching device includes a metal oxide switching element 104 overlying the first electrode. The metal oxide can include zinc oxide, titanium oxide, tungsten oxides and others. Other switching medium such as certain intrinsic semiconductor material may also be used.

In a specific embodiment, the metal oxide is a tungsten oxide material. The tungsten oxide material is formed overlying a tungsten electrode in a specific embodiment. The tungsten electrode can be tungsten metal in a specific embodiment. In other embodiment, the tungsten electrode can be a tungsten thin film formed on a metal, for example a noble metal, or its alloy. In a specific embodiment, the tungsten oxide material is formed by subjecting the tungsten metal or the tungsten thin film to an oxygen environment. In a specific embodiment, the tungsten oxide has a stoichiometry represented by $WO_{3-x}$, where x ranges from about 0 to 0.5 in certain embodiments, which is oxygen deficient. In a specific embodiment, the tungsten oxide material is further characterized by a $W^{5+}$ to $W^{6+}$ ratio, where the $W^{5+}$ state is oxygen deficient in a specific embodiment. In a specific embodiment, the one or more oxygen deficient sites form a gradient with a higher density of the oxygen deficient sites at a surface region of the tungsten oxide material and a lower density of oxygen deficient sites at a tungsten/tungsten oxide interface region. The tungsten oxide material formed by oxidation of the tungsten electrode has a thickness that is limited by diffusivity of oxygen into bulk region of tungsten at the reaction temperature. For example, at the reaction of about 400 degree Celsius, the thickness of tungsten oxide layer can range from about 30 nm to about 50 nm depending partly on the surface condition, for example, roughness of the tungsten surface. Depending on the embodiment, the tungsten oxide material is amorphous or polycrystalline and oxygen deficient sites are formed in grain boundary regions of the amorphous or polycrystalline tungsten oxide material. The oxygen deficient sites in the grain boundary regions cause the grain boundary regions to exhibit a lower resistance than the bulk region in a specific embodiment. Upon applying of a suitable voltage, the oxygen deficient sites migrate from the grain boundary regions to the bulk region or from the bulk region to the grain boundary region providing for resistive switching for the switching device.

In other embodiments, the tungsten oxide material may be formed using deposition techniques such as chemical deposition (for example, chemical vapor deposition, or atomic layer deposition, and others) or physical deposition (for example, sputtering, evaporation, and others), and others.

Referring again to FIG. 1, the switching device includes a second electrode 106 overlying the metal oxide switching element. The second electrode is configured spatially orthogonal to the first electrode and operably coupled to the first electrode in a specific embodiment. As shown, the metal oxide switching element is sandwiched between the first electrode and the second electrode. The second electrode is preferably formed using an inert metal or a noble metal so as not to chemically react with the metal oxide, for example, tungsten oxide in the switching layer. Examples of such metal can include gold, platinum, palladium, and the like. Of course one skilled in the art would recognize other modifications.

In a specific embodiment, a switching device structure is provided. The switching device structure includes a tungsten electrode provided as a tungsten metal or a tungsten thin film formed on a noble metal. The switch device structure includes a tungsten oxide switching element sandwiched between the tungsten electrode and a noble metal electrode in a specific embodiment.

Depending on the embodiment, there can be other variations. For example, the first electrode and the second electrode can be provided in a crossbar configuration for interconnectivity and scalability for the non-volatile memory devices in a specific embodiment. The switching element is sandwiched between the first electrode and the second electrode disposed in an intersection region of the first electrode and the second electrode. Of course one skilled in the art would recognize other variations, modifications, and alternatives. For example the first electrode and the second electrode can be arranged orthogonal to each other. The first electrode and the second electrode may also be intersecting at an angle other than 90 degrees depending on the embodiment.

Figure 2:
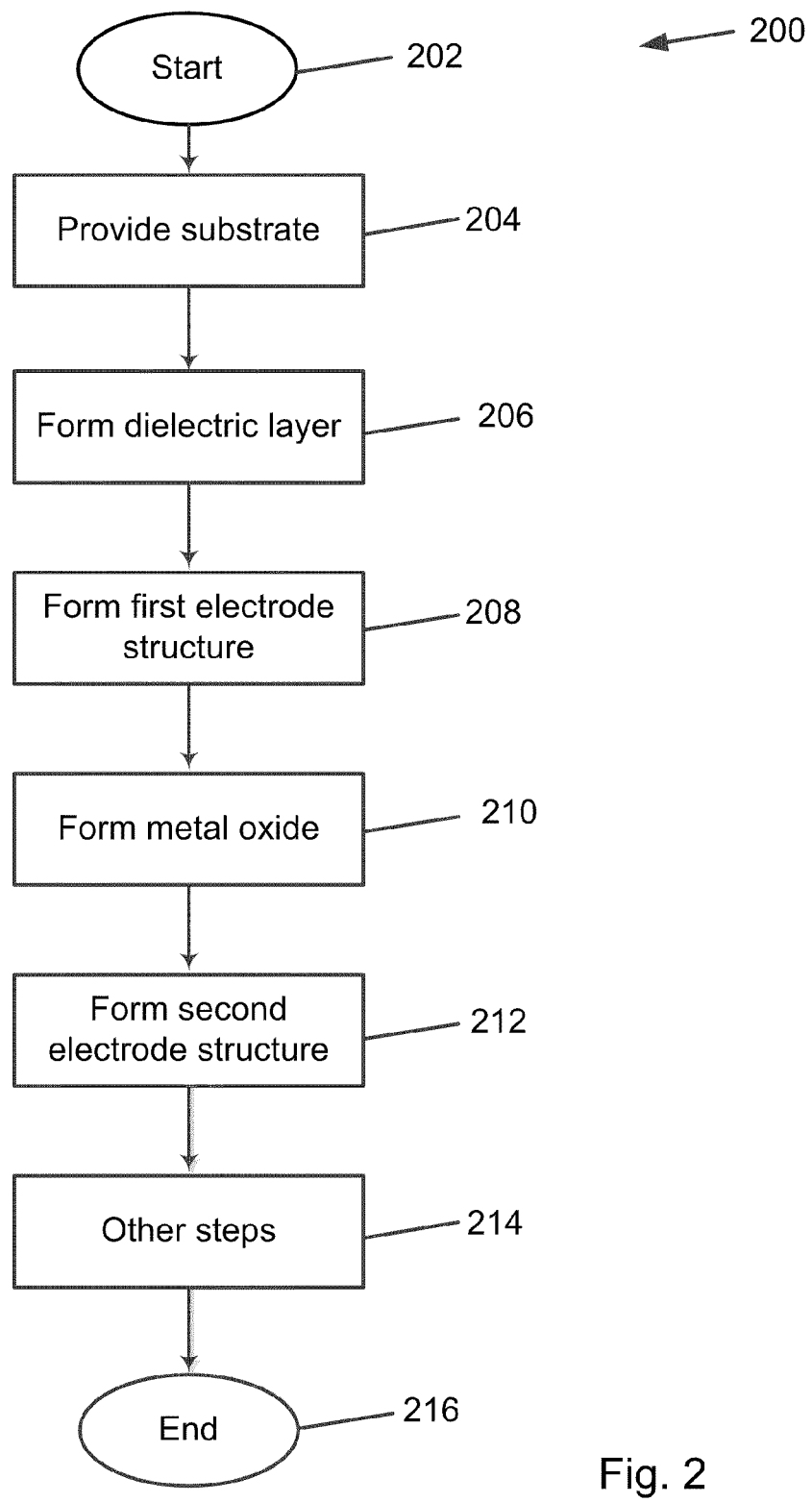
FIGS. 2-8 are simplified diagrams illustrating a method of forming a resistive switching non-volatile memory device according to an embodiment of the present invention.

FIG. 2 is a simplified process flow illustrating a method 200 of forming a non-volatile resistive switching device according to an embodiment of the present invention. As shown, the method includes a start step (Step 202). A semiconductor substrate is provided (Step 204). The semiconductor substrate can be a single crystal silicon wafer or silicon on insulator (commonly called SOI) substrate or a silicon germanium substrate depending on the embodiment. The method includes forming a dielectric layer overlying a surface region of the semiconductor substrate (Step 206). The dielectric layer is silicon oxide in a specific embodiment. Other dielectric materials may also be used. These other dielectric materials may include silicon nitride, multilayer dielectric stack such as oxide on nitride on oxide (ONO) stack or high K dielectric materials depending on the embodiment. In other embodiments, the semiconductor substrate can include one or more MOS devices formed thereon. The one or more MOS devices are operably coupled to the switching device and controllable by the switching device in certain embodiment.

In a specific embodiment, the present method includes forming a first electrode structure overlying the dielectric layer (Step 208). The first electrode structure can be formed by depositing a tungsten layer using, for example, a sputtering process. In a specific embodiment, the tungsten layer can have a thickness ranging from about 50 to about 100 nm. The tungsten layer is then patterned using a lithography step (such as photolithography, nanoimprint lithography or e-beam lithography) followed by reactive ion etching. The resulting first electrode structure can have a width ranging from about 10 nm to about 200 nm in some embodiments and ranging from about 40 nm to about 80 nm in other more specific embodiments.

The method then subjects the tungsten layer, which is now in a form of nanowire to an oxidation process (Step 210) to form a tungsten oxide material. The oxidation process can be provided using a rapid thermal process at a temperature of about 350 to about 450 degree Celsius in an oxygen environment for at least some embodiments, and in more a specific embodiment is carried out at a temperature of about 380 to about 450 degree Celsius. Process time can range from about 1 minute to about 10 minutes in some embodiments and from about 2 minutes to about 4 minutes in a more specific embodiment. In other embodiments, the oxidation process can be performed in an oxygen plasma environment at a deposition temperature of about 350-450 Degree Celsius and in more specific embodiments in a range of 400-450 Degree Celsius. In a specific embodiment, the tungsten oxide can have a thickness of about 15-50 nm or in more specific embodiments a thickness of about 25-50 nm, depending on the application. The tungsten oxide material provides for a switching element for the non-volatile memory device in a specific embodiment. Alternatively the tungsten oxide material can be formed using physical deposition such as sputtering or a chemical deposition. One skilled in the art would recognize other variations, modifications and alternatives.

In a specific embodiment, a second electrode structure is formed overlying the tungsten oxide switching layer (Step 212). The second electrode structure is formed by depositing a noble metal layer overlying the tungsten oxide switching layer in a specific embodiment. The noble metal layer can be gold, platinum, palladium, or their respective alloy, or a combination, and others. The noble metal layer may be deposited using techniques such as sputtering, evaporation, or chemical deposition process or electrochemical deposition, for example electroplating, depending on the embodiment. In certain embodiments, the noble metal layer is patterned using e-beam or photo-lithography followed by a lift-off or RIE etching to form the second electrode structure. In a specific embodiment, the second electrode structure is formed using palladium, but of course can also be others.

Embodiments may include other steps (Step 214) to complete the non-volatile switching device, for example, backend process such as metallization, isolation, and passivation. The method stops at end step (Step 216).

The above sequence of steps provides a method of forming a non-volatile memory device according to an embodiment of the present invention. Depending on the embodiment, one or more steps may be added, one or more steps may be eliminated, and one or more steps may be provided in a difference sequence without departing from the scope of the invention. One skilled in the art would recognize other modifications, variations, and alternatives.

Figure 3:
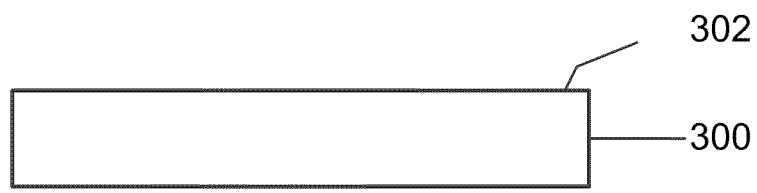

FIGS. 3-9 are simplified diagrams illustrating a method of forming a non-volatile memory device according to an embodiment of the present invention. As shown in FIG. 3, a semiconductor substrate 300 including a surface region 302 is provided. The semiconductor substrate can be a single crystal silicon wafer or a silicon-on-insulator (commonly called SOD substrate or a silicon-germanium substrate depending on the embodiment. In a specific embodiment, a p-doped single crystal silicon can be used. Of course silicon of a different impurity type may also be used, depending on the application. The semiconductor substrate can have one or more CMOS device for controlling circuitry for the non-volatile memory device formed thereon.

Figure 4:
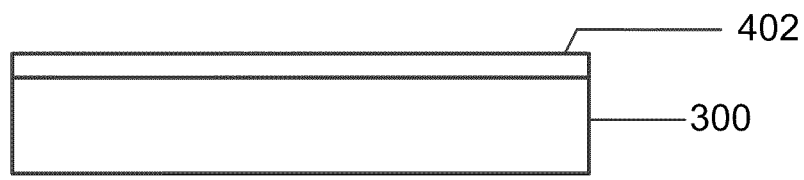

As shown in FIG. 4, the method includes forming a first dielectric layer 402 overlying the surface region. The first dielectric layer is usually a silicon oxide in a specific embodiment. Other suitable dielectric materials may also be used. These other dielectric materials may include silicon nitride, multilayer dielectric stack such as oxide on nitride on oxide (ONO) stack, low K dielectric material, or high K dielectric materials depending on the embodiment. These dielectric material may be deposited using techniques such as LPCVD (low pressure chemical vapor deposition), PECVD (plasma enhanced chemical vapor deposition), HDPCVD (high density plasma chemical vapor deposition), ALD (atomic layer deposition), and others.

Figure 5:
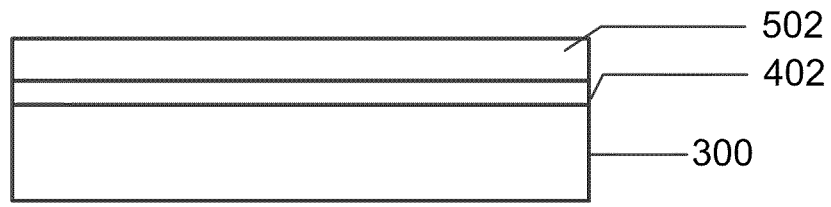

Referring now to FIG. 5. The method forms a first electrode layer 502 overlying the dielectric layer. The first electrode layer can be formed using a tungsten material in a specific embodiment. Depending on the embodiment, the tungsten material can be deposited using physical vapor deposition such as sputtering or evaporation, at room temperature from a tungsten target. Depending on the embodiment, the tungsten layer can range from about 50 nm to about 100 nm to provide for a nano-scale first electrode structure. The tungsten material can also be deposited using a chemical vapor deposition technique using tungsten hexafluoride ($WF_6$) and a suitable reducing species such as hydrogen in a specific embodiment. Deposition temperature is usually kept at about 250 Degree Celsius to about 500 Degree Celsius and preferably ranging from about 340 Degree Celsius to about 360 Degree Celsius in some embodiments and at about 350 Degree Celsius in a more specific embodiment.

In other embodiments, the tungsten material may be deposited on a first metal layer as a tungsten thin film material. The first metal layer can be noble metals (for example, platinum, palladium, gold, and others) in a specific embodiment.

Figure 6:
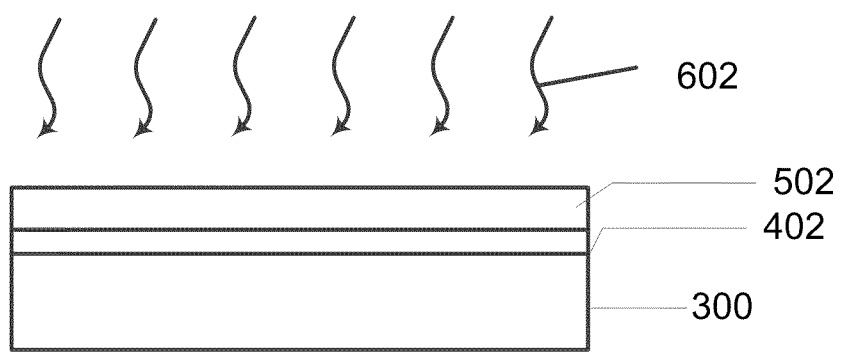
Figure 7:
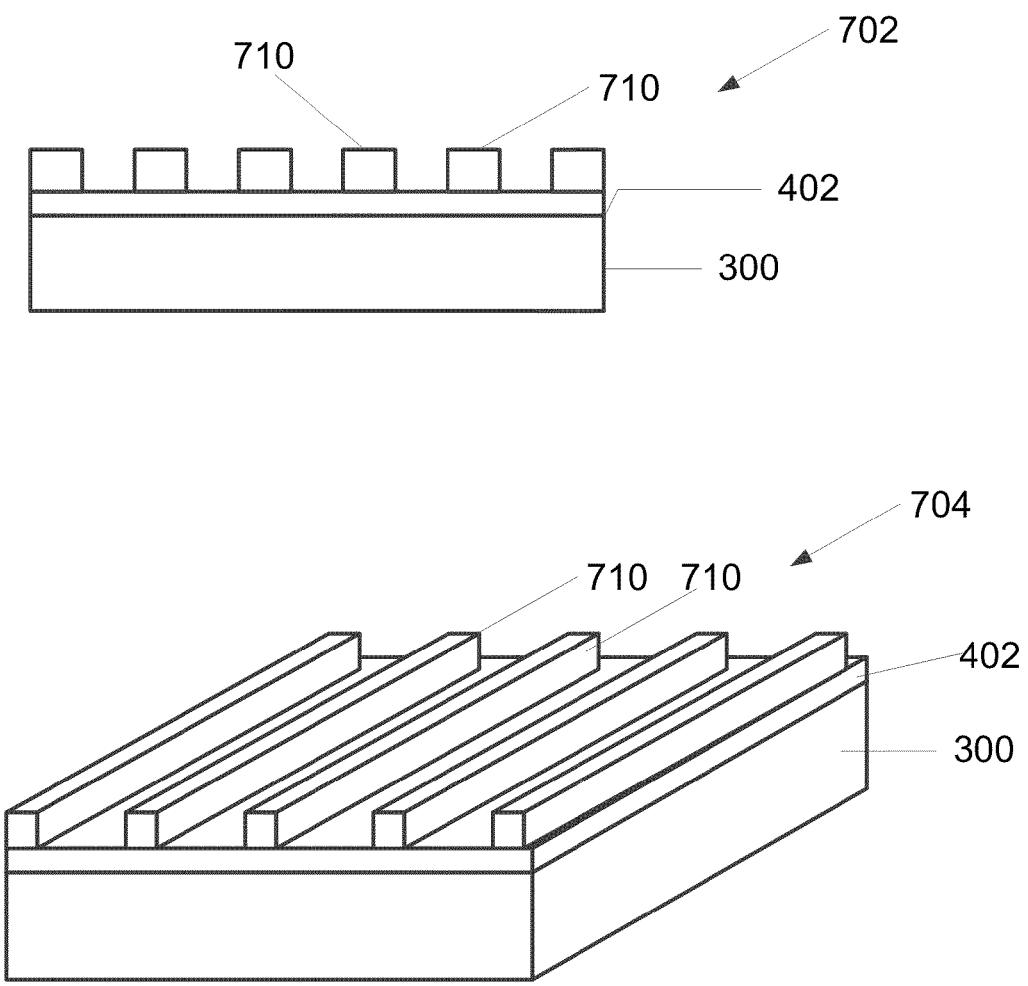

Referring to FIG. 6, the first electrode layer is subjected to a pattern followed by an etch process 602 to form a first electrode structure in a specific embodiment. The pattern step is performed using e-beam or photo-lithography in a specific embodiment. The etch process may use a reactive ion etching (RIE) after pattern in a specific embodiment. For tungsten as the first metal layer, the reactive ion etching uses a fluorinated gas such as $SF_6$ and the like. Other suitable etching techniques such as wet etch may also be used depending on the application. In a specific embodiment, the first electrode structure comprises of a nanowire structure having a width of about 10 nm to about 200 nm in some embodiments, and from about 40 nm to about 80 nm in some more specific embodiments. An exemplify illustration of the nanowire structure 710 is shown in FIG. 7. Cross sectional view 702 and perspective view 704 are shown.

Figure 7A:
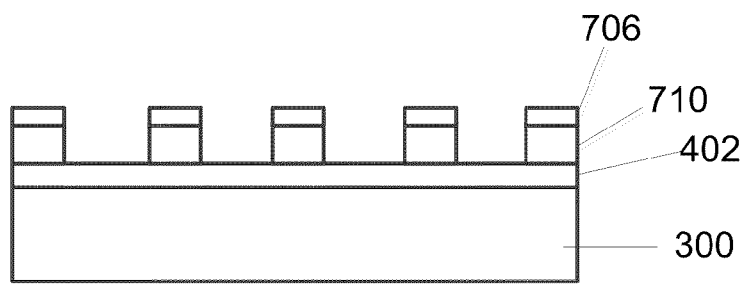
Figure 7A:
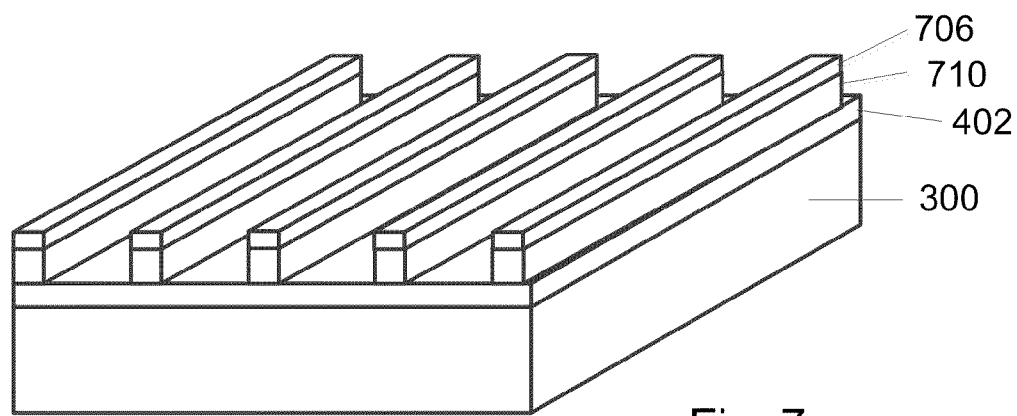

In a specific embodiment, the method includes forming a metal oxide switching layer 706 overlying the first electrode structure as shown in FIG. 7*a*. For tungsten material as the first electrode structure, the metal oxide is a tungsten oxide material formed by subjecting the tungsten material to an oxygen environment. Depending on the application, the tungsten oxide layer can be formed using a rapid thermal process in a substantially pure oxygen ambient. Reaction temperature can range from about 350 Degree Celsius to about 450 Degree Celsius and preferably at a range from about 380 Degree Celsius to about 425 Degree Celsius, and more preferably at about 400 Degree Celsius depending on the embodiment. Other method of forming the tungsten oxide layer can include a plasma assisted oxidation whereby the tungsten oxide layer is formed in oxygen plasma at a temperature of about 400 Degree Celsius.

The tungsten oxide formed has a stoichiometry represented by $WO_{3-x}$, where x can range from 0 to about 2 and preferably about 0 to 0.5, which is oxygen deficient, in certain embodiments. The tungsten oxide can be characterized by a $W^{5+}$ to $W^{6+}$ ratio in certain embodiments, where the $W^{5+}$ state is oxygen deficient in a specific embodiment. In a specific embodiment, an as formed tungsten oxide material is in an amorphous state. The amorphous state is transformed into a polycrystalline state at a temperature greater than about 300 Degree Celsius. A longer reaction time would also promote polycrystalline tungsten oxide formation. The tungsten oxide layer is characterized by a thickness limited by diffusivity of oxygen into a bulk region of tungsten at the reaction temperature. At the reaction temperature of about 400 degree Celsius, the thickness of tungsten oxide layer can range from about 30 nm to about 50 nm depending partly on the surface condition, for example, roughness of the tungsten surface. In a specific embodiment, the one or more oxygen deficient sites form a gradient with a higher density of the oxygen deficient sites at a surface region of the tungsten oxide material and a lower density of oxygen deficient sites at a tungsten/tungsten oxide interface region.

Figure 7B:
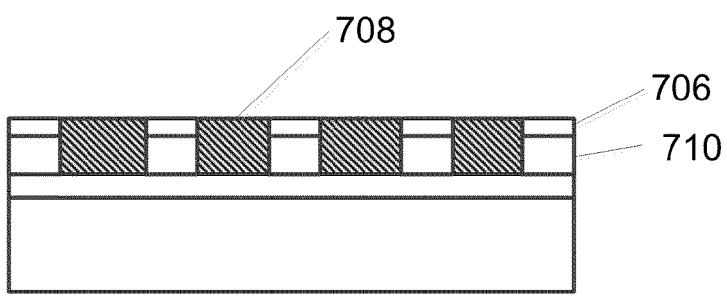

As shown in FIG. 7*b*, the method includes forming a second dielectric material 708 overlying first electrode structure 710 and tungsten oxide material 706 and filling a gap between the first electrode structure to isolate the first electrode structure 710 in a specific embodiment. The second dielectric material can be a silicon oxide in a specific embodiment. Other suitable dielectric materials may also be used. These other dielectric materials may include silicon nitride, multilayer dielectric stack such as oxide on nitride on oxide (ONO) stack, low K dielectric material, or high K dielectric materials depending on the embodiment. These dielectric material may be deposited using techniques such as LPCVD (low pressure chemical vapor deposition), PECVD (plasma enhanced chemical vapor deposition), HDPCVD (high density plasma chemical vapor deposition), ALD (atomic layer deposition), and others. Second dielectric material can be subjected to a planarization process to expose a top surface of the tungsten oxide material and to isolate at least the first electrode structure in a specific embodiment.

Figure 8:
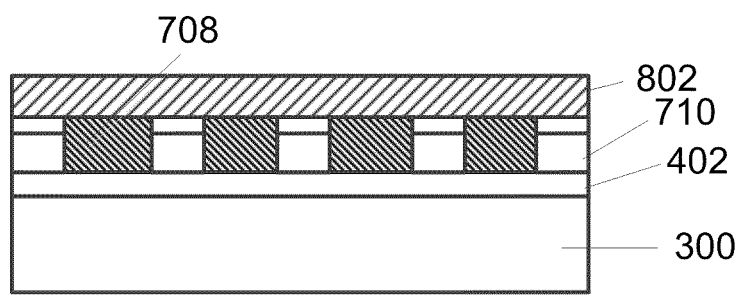

In a specific embodiment, the method forms a second electrode 802 overlying the metal oxide switching layer as shown in FIG. 8. The second electrode can be configured spatially orthogonal to the first electrode and operably coupled to the first electrode in a specific embodiment. Other geometrical arrangements may also be used depending on the application. As shown, the metal oxide switching element is sandwiched between the first electrode and the second electrode. The second electrode is preferably formed using an inert metal or a noble metal so as not to chemically react with the metal oxide switching layer. Examples of such metal can include gold, platinum, palladium, and the like. The second electrode material can be formed by using a physical deposition or a chemical deposition followed by a pattern and an etch process. Depending on the application, the second electrode can be formed by technique such as a damascene process. Of course one skilled in the art would recognize other modification, variations, and alternatives. As described, the first electrode and the second electrode can be provided spatially in a crossbar configuration allowing for interconnectivity and scalability in a specific embodiment.

In a specific embodiment, the tungsten oxide layer formed can be characterized by a gradient of the number of oxygen deficient sites within the tungsten oxide layer. The number of oxygen deficient sites is higher at a tungsten oxide layer surface and lower at the tungsten oxide/tungsten interface. In a specific embodiment, this gradient of the number of oxygen deficient sites enables bipolar switching as shown in the I-V curves in FIG. 9. The IV plots are measured from a switching device having a configuration $Pd/WO_{3-x}/W$ and a device size of about 80 nm by 80 nm. Device parameters are given below:

Second electrode: Pd
Switching layer: $WO_{3-x}$, about 30-40 nm thick
First electrode: W, about 60 nm in width A general trend is that, a positive voltage applied to the second electrode during programming causes the oxygen deficient sites to migrate towards the bottom electrode and an increase in conductance in the tungsten oxide layer. A negative bias voltage applied on the second electrode would cause the oxygen deficient sites to move to the surface region of the tungsten oxide layer and the tungsten oxide is now in a high resistance state.

Figure 9:
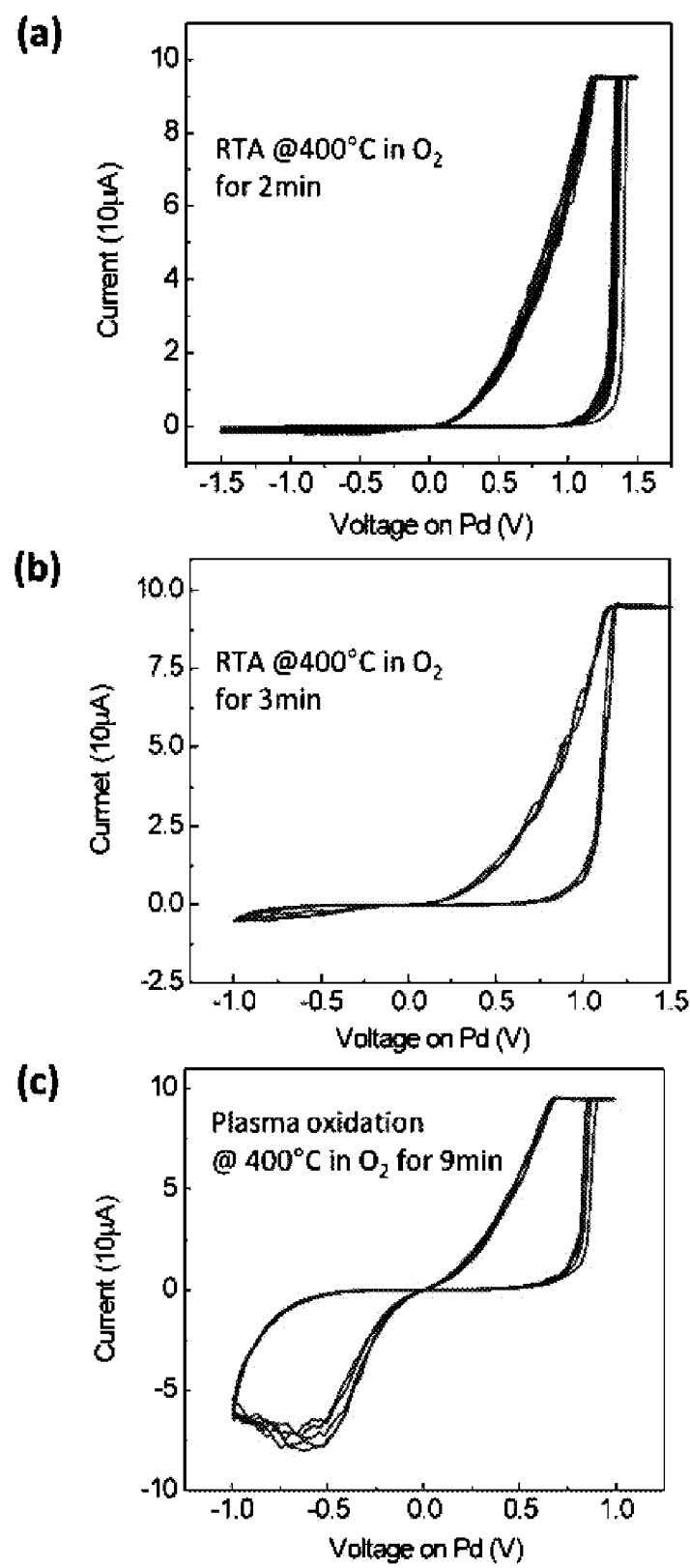
FIG. 9 are plots illustrating current-voltage characteristics for the resistive switching non-volatile memory device according to an embodiment of the present invention.

In a specific embodiment, the number and the density of the oxygen deficient sites in the tungsten oxide layer can be increased by a longer oxidation time at a given temperature. FIG. 9 illustrates I-V curves for the Pd/WO$_{3-x}$/W switching device in which tungsten oxide is formed under different process conditions:

Plot (a) is an I-V curve of the switching device where the tungsten oxide is formed by a RTA process in oxygen for about 2 minutes at 400 Degree Celsius.

Plot (b) is an I-V curve of the switching device where the tungsten oxide is formed by a RTA process in oxygen for about 3 minutes at 400 Degree Celsius.

Plot (c) is an I-V curve of the switching device where the tungsten oxide is formed in oxygen plasma for about 9 minutes at 400 Degree Celsius.

As shown in plots (a), (b) and (c), under a positive bias to the second electrode, the oxygen deficient sites migrate readily towards the first electrode as the density of the oxygen deficient sites is high and the device is in an ON state. When a negative bias is applied, the device transitions from the ON state to the OFF state, while the oxygen deficient sites from the W/WO$_{3-x}$ interface region move towards the second electrode. This sequential move of the oxygen deficient sites can cause a delay in the erase process. In plot (c) where the reaction time for tungsten oxide formation is longer, it appears that the device exhibits a non-rectifying switching. Of course, there can be other variations, modifications, and alternatives.

Figure 10:
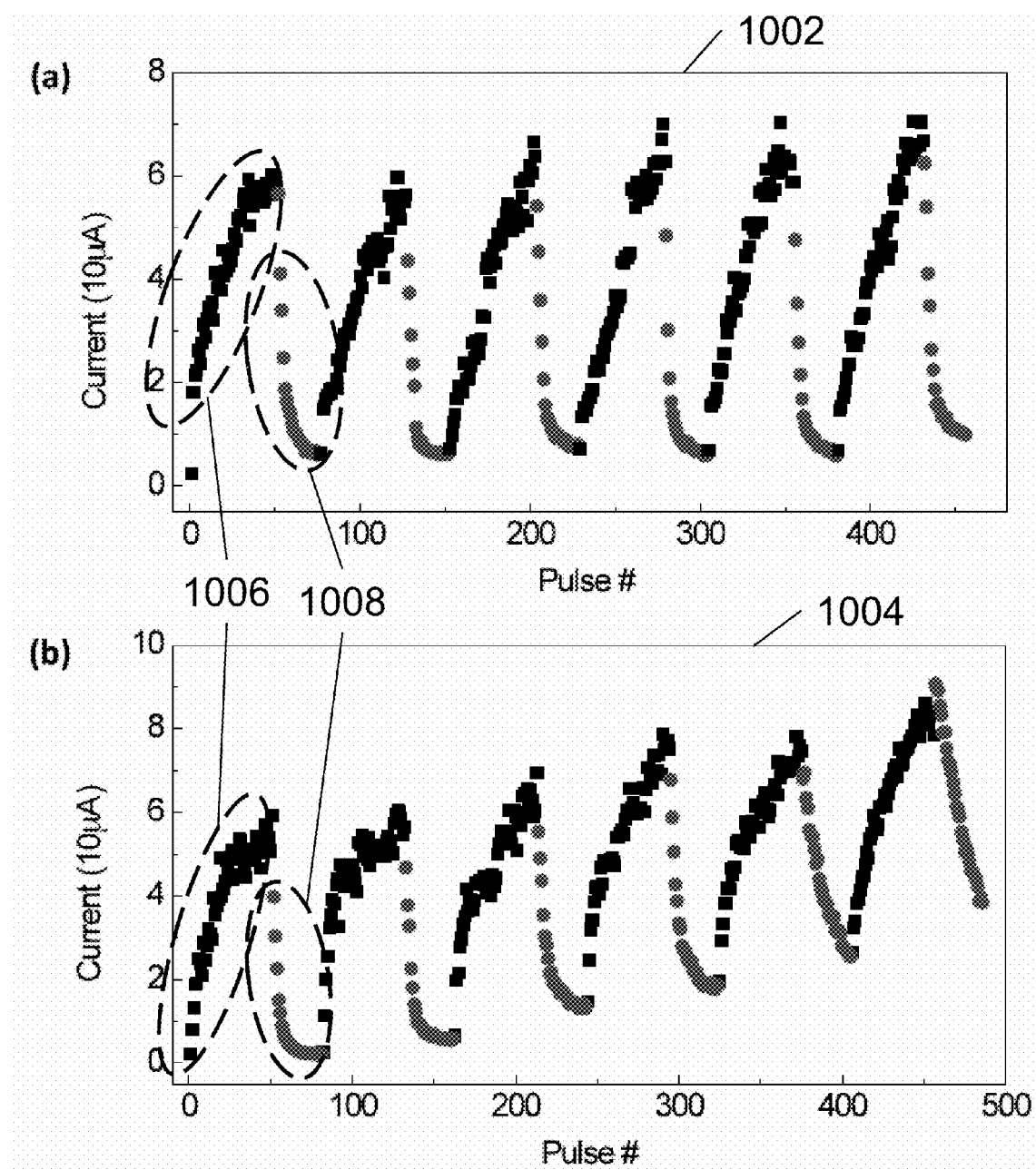
FIG. 10 illustrates pulse response of the resistive switching non-volatile memory device according to an embodiment of the present invention.

In a specific embodiment, pulse response of the switching device having a device configuration Pd/WO$_{3-x}$/W is presented in current vs. pulse plot 1002 in FIG. 10. As shown, the switching device is read at a voltage of 0.4 volts after each positive pulse 1006 or negative pulse 1008. In plot 1002, the device is read at 0.4 volts after a 1.4 volt/10 μs write pulse or a −1.3 volt/10 μs erase pulse. In plot 1004, the device is read at the same voltage of 0.4 volt and same 1.4 volt/10 μs write but erased at a lower voltage pulse of −1.2 volt/10 us pulse. As shown, the decrease in the erase voltage results in an overall increase in the conductance of the switching device in a specific embodiment. Further shown in FIG. 10, relatively small and short (1.4V, 10 μs) applied pulses modulate the device conductance gradually.

Figure 11:
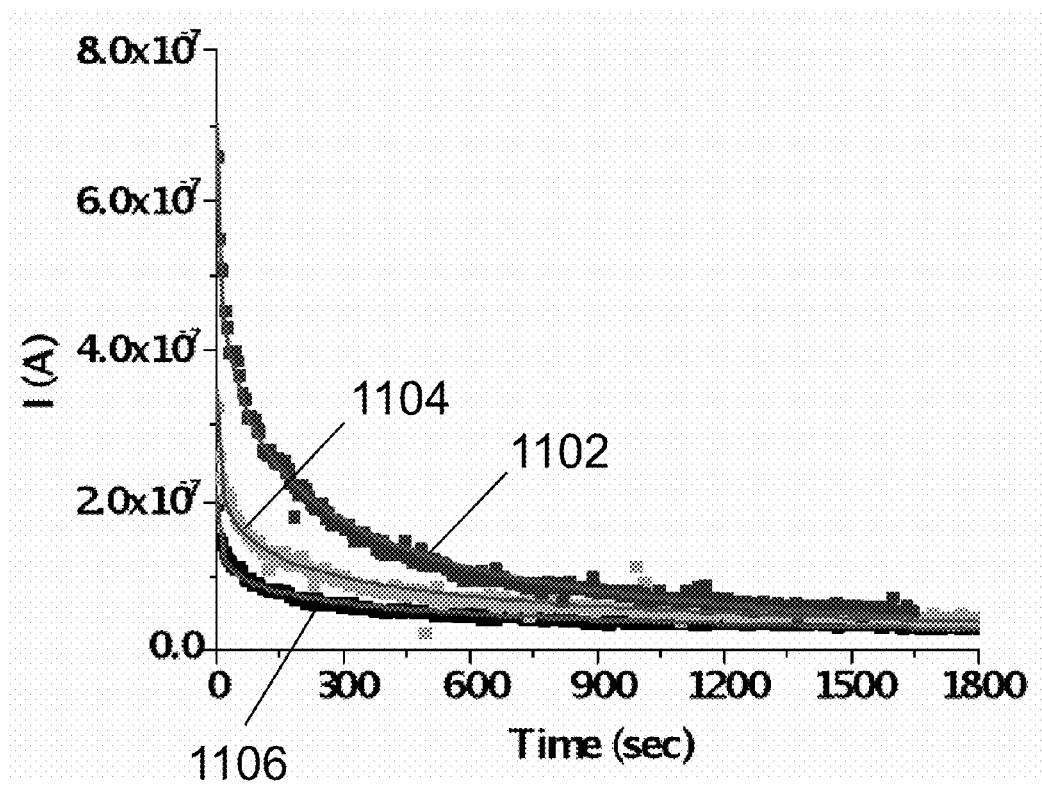
FIG. 11 illustrates a retention characteristic of the resistive switching non-volatile memory device according to an embodiment of the present invention.

In a specific embodiment, retention characteristic and the corresponding IV curve of the switching device is illustrated in FIG. 11. The device is first written into a various high conductance states, for example, in plots 1102, 1104, and 1106, and a device resistance is measured over time for the various high conductance states. As shown, a decrease in current or information loss reaches a steady state over time after a fast initial decay. This behavior may be explained by a stretched exponential model:

$$I = a * \exp\left(-\left(\frac{t}{\tau}\right)^b\right)$$

where I is the current, t is the time and a, b and τ are constants and consistent with diffusion of oxygen deficient sites in a disordered system as applied to an amorphous WO$_{3-x}$. This behavior may be used in certain applications such as neuromorphic application in which a learning process occurs periodically in a short time interval.

Figure 12:
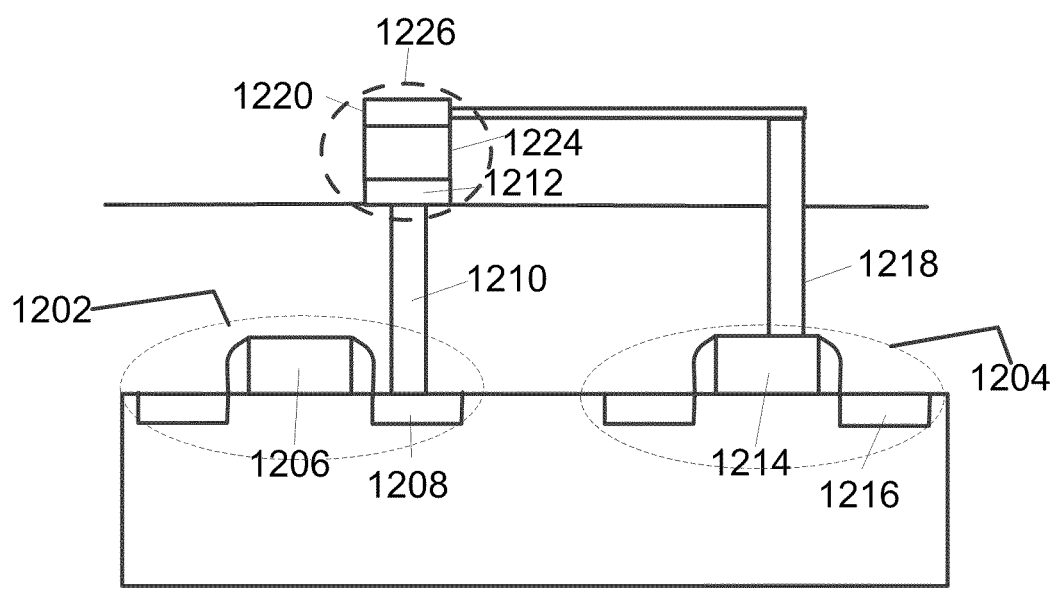
FIG. 12 is a simplified diagram illustrating a resistive switching device coupled to MOS structures according to an embodiment of the present invention.

In a specific embodiment, the switching device may be provided to configure one or more MOS device. A switching device fabricated using tungsten electrode is especially well suited for such an application. As shown in FIG. 12, a first MOS device 1202 and a second MOS device 1204 are provided. The first MOS device includes a first gate structure 1206 and first active regions 1208 and a first interconnect structure 1210. The first interconnect structure can be connected to the first active region 1208 or the first gate structure 1206 depending on the embodiment. In a specific embodiment, first interconnect structure 1210 comprises a tungsten plug. As shown, first interconnect structure 1210 provides for a first electrode 1212 of a switching device 1226. The second MOS device includes a second gate structure 1214, second active regions 1216, and a second interconnect structure 1218. As shown, the second interconnect structure 1218 is coupled to a second electrode 1220 for switching device 1226 in a specific embodiment. In a specific embodiment, the first MOS device and the second MOS device may be operably connected or disconnected by a controlling a resistance of the switching element 1224 of the switching device. Therefore FIG. 12 is for illustrative purpose only and other variations, modifications, and alternatives exist as would be recognized by one skilled in the art.

Figure 13:
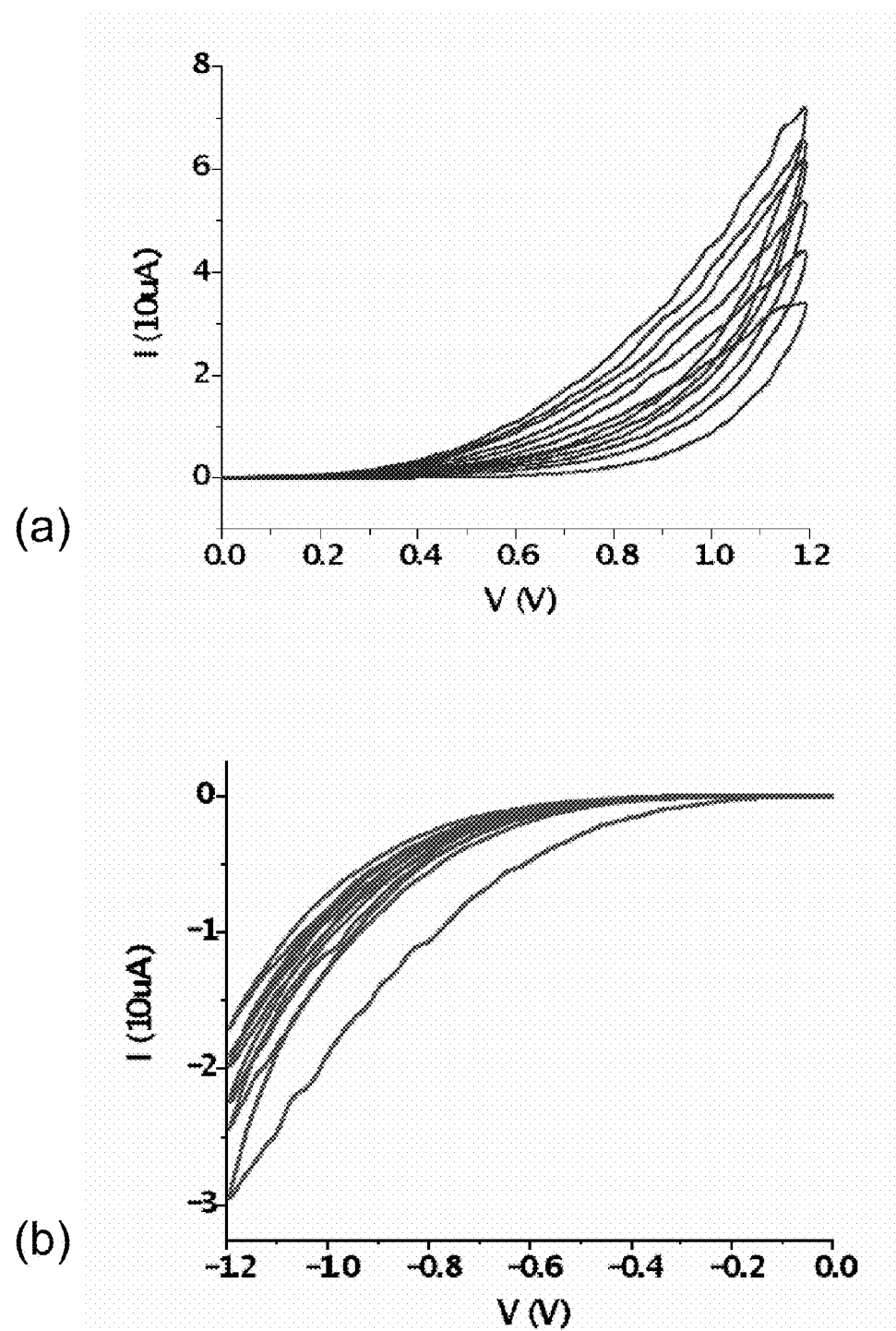
FIG. 13 illustrates simplified I-V plots of a switching device according to an embodiment of the present invention.

In other embodiments, the metal oxide switching device can use an inert metal such as Pd, Pt, Au, or Ag and the like for both the top electrode and the bottom electrodes. The switching characteristics are illustrated in I-V plots in FIG. 13. As shown in plot (a), a continuous positive increase in voltage results in a continuous increase in current or conductance of the device. A continuous negative increase in voltage results in a continuous decrease in current or conductance of the device as shown in plot (b). This behavior illustrates that switching in the device is determined by the tungsten oxide switching layer, independent from the electrode material. In a specific embodiment, the continuous change of the current with voltage allows for an analog memory effect.

Figures 14A, 14B, 14C:
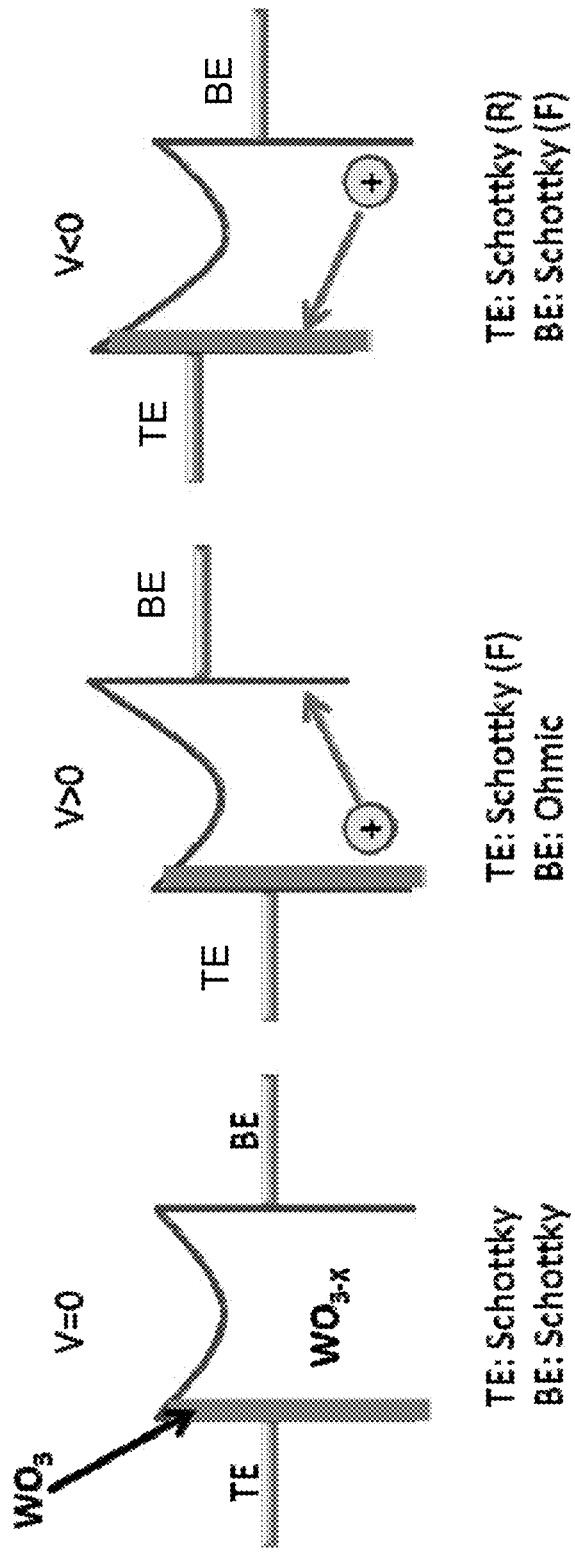
FIG. 14 illustrates simplified Shottky behaviors of a switching device according to embodiments of the present invention.

Referring now to FIGS. 14(*a*), 14(*b*), and 14(*c*). In certain embodiments, top metal electrode (TE) and the metal oxide switching layer can form a first Schottky junction. The bottom metal electrode (BE) and the metal oxide switching layer can form a second Schottky junction as shown in FIG. 14(*a*).

As illustrated in FIG. 14(*b*), during programming, a positive voltage applied to the top electrode drives oxygen vacancies towards the bottom interface, making the tungsten oxide near second Schottky junction heavily doped. As a result, the second Schottky junction effectively behaves as an Ohmic contact. Since the first Schottky junction is forward biased in this configuration, a large current can thus flow through the device, e.g. the device is turned on. The amount of oxygen injected into the WO$_{3-x}$ layer near the second Schottky junction is a function of the amplitude and duration of the applied voltage, hence the switching is analog (the resistance change is continuous). These cases correspond to the positive voltage conditions in FIG. 9(*a*) or 9(*b*).

As Shown in FIG. 14(*c*), during erasing, a negative voltage applied to the top electrode drives oxygen vacancies away from the bottom electrode. As a result, the second Schottky junction behaves as a forward-biased Schottky junction whose resistance is increased as more oxygen vacancies are driven away from the second Schottky junction causing increased carrier depletion in the WO$_{3-x}$ region. The device resistance during erase also depends on the amplitude and duration of the applied voltage. Since the first Schottky junction is reverse-biased, the overall current through the device will be low. These cases correspond to the negative voltage conditions in FIG. 9(a) or 9(b).

In other embodiments, the tungsten oxide layer near the top junction becomes very non-stoichiometric and there exist a large amount of oxygen deficiencies near the top junction (e.g. for conditions corresponding to FIG. 9(c)). As a result, the first Schottky junction effectively behaves as an Ohmic contact, regardless of bias conditions. The bottom metal electrode and the metal oxide switching layer can form a second Schottky junction. During programming, a positive voltage applied to the top electrode drives oxygen vacancies towards the bottom interface, making the tungsten oxide near second Schottky junction heavily doped. As a result, the second Schottky junction effectively behaves as an Ohmic contact. A large current can thus flow through the device, e.g. the device is turned on. The amount of oxygen injected into the $WO_{3-x}$ layer near the second Schottky junction is a function of the amplitude and duration of the applied voltage, hence the switching is analog (the resistance change is continuous). These cases correspond to the positive voltage conditions in FIG. 9(c).

During erasing, a negative voltage applied to the top electrode drives oxygen vacancies away from the bottom electrode. As a result, the second Schottky junction behaves as a forward-biased Schottky junction whose resistance is increased as more oxygen vacancies are driven away from the second Schottky junction causing increased carrier depletion in the $WO_{3-x}$ region. Since the first junction effectively behaves as an Ohmic contact and the second junction if forward-biased, the device still shows high conductance under reverse-bias until sufficient oxygen deficiencies are removed from the second junction region to cause large depletion. The device resistance during erase also depends on the amplitude and duration of the applied voltage. These cases correspond to the negative voltage conditions in FIG. 9(a) or 9(b).

Depending on the embodiment, there can be other variation. For example, both the first electrode structure and the second electrode structure can be formed using a noble metal, of a same kind or a different kind. In additional, although tungsten oxide material has been described as a switching material, other metal oxides such as nickel oxide or metal oxides that exhibit more than one oxidation states and have oxygen deficiency sites may also be used. It is therefore understood that the examples and embodiments described herein are for illustrative purposes only and that various modifications or alternatives in light thereof will be suggested to persons skilled in the art and are to be included within the spirit and purview of this application and scope of the appended claims.

What is claimed is:

1. A switching device, comprising:
   a first electrode, the first electrode including a first metal material;
   a resistive switching element overlying the first electrode, the resistive switching element comprising a metal oxide material characterized by a plurality of oxygen deficient sites; and
   a second electrode overlying the resistive switching element, the second electrode including a second metal material, wherein the first metal material and the second metal material do not appreciably react with the resistive switching element;
   wherein the plurality of oxygen deficient sites are caused to migrate within the resistive switching element towards the first electrode or the second electrode upon a positive voltage applied to the second electrode or the first electrode, respectively, wherein migration of the plurality of oxygen deficient sites is characterized by a continuous change of conductance of the resistive switching element with a continuous change in magnitude of the positive voltage applied, and wherein the continuous change of conductance of the resistive switching element provides for an analog memory device.

2. The device of claim 1 wherein the metal oxide material is selected from the group consisting of: a tungsten oxide material, a nickel oxide material, and a titanium oxide material.

3. The device of claim 1 wherein the plurality of oxygen deficient sites are caused to migrate from a region in a vicinity of the second electrode towards the first electrode when the positive voltage is applied to the second electrode.

4. The device of claim 3 wherein the plurality of oxygen deficient sites are caused to migrate from the first electrode towards the second electrode when a negative voltage is applied to the second electrode.

5. The device of claim 1 wherein each of the first electrode and the second electrode includes at least respective portions comprising respective nanowire structures, and wherein the first electrode and the second electrode are spatially arranged in an orthogonal manner forming a crossbar structure.

6. The device of claim 1 wherein the resistive switching device is provided in an interconnected crossbar array.

7. The device of claim 1 wherein the resistive switching element is sandwiched between the first electrode and the second electrode, the resistive switching element being disposed in an intersecting region of the first electrode and the second electrode and operably coupled to the first electrode and the second electrode.

8. The device of claim 1 wherein the plurality of oxygen deficient sites is caused to migrate from the second electrode towards the first electrode when a positive bias voltage is applied to the second electrode, thereby increasing a conductance of the resistive switching element, and wherein the plurality of oxygen deficient sites is caused to migrate back towards the second electrode when a negative bias voltage is applied to the second electrode, thereby increasing a resistance of the resistive switching element.

9. The device of claim 1 wherein the first electrode comprises a metal selected from the group consisting of: Au, Pt, Pd, Al, W, and Ag.

10. The device of claim 1 wherein the first electrode comprises a tungsten material, the resistive switching element comprises a tungsten oxide material having a stoichiometry of $WO_{3-x}$, and the second electrode comprises a metal selected from the group consisting of: platinum and palladium.

11. The device of claim 10 wherein the tungsten material is tungsten metal.

12. The device of claim 10 wherein the tungsten material comprises a tungsten film material formed on a conductor material.

13. The device of claim 12 wherein the conductor material is selected from the group consisting of: gold, silver, platinum, palladium, a semiconductor material, and doped Si.

14. The device of claim 10 wherein the tungsten oxide material is formed by oxidation of the tungsten material.

15. The device of claim 10 wherein the first electrode is spatially configured orthogonally relative to the second electrode.

16. The device of claim 10 wherein the tungsten oxide material is formed by a process selected from the group consisting of: chemical deposition, CVD, ALD, physical deposition, sputtering, and evaporation.

17. The device of claim 10 wherein the tungsten oxide material comprises a tungsten sub-oxide.

18. The device of claim 10 wherein the tungsten oxide material is characterized by a $W^{5+}$ to $W^{6+}$ ratio, wherein the $W^{5+}$ state is oxygen deficient.

19. The device of claim 10 wherein the plurality of oxygen deficient sites form a gradient with a higher density of the plurality of oxygen deficient sites at a surface region of the tungsten oxide material and a lower density of oxygen deficient sites at a tungsten/tungsten oxide interface region.

20. The device of claim 10 wherein the $W^{5+}$ to $W^{6+}$ ratio is increased by an oxidation temperature greater than about 300 Degree Celsius, oxidation time, or a combination thereof.

21. The device of claim 10 wherein an oxidation temperature causes an as-grown tungsten oxide to change from an amorphous state to a polycrystalline state.

22. The device of claim 10 wherein the plurality of oxygen deficient sites form in a grain boundary region of polycrystalline tungsten oxide and the plurality of oxygen deficient sites cause the grain boundary region to have a lower resistance than a bulk region.

23. The device of claim 10 wherein the migration of the plurality of oxygen deficient sites in a grain boundary region of the resistive switching element allows for resistive switching for the device.

24. The device of claim 1 wherein the first electrode and the resistive switching element form a first Schottky junction, and the second electrode and the resistive switching element form a second Schottky junction.

25. The device of claim 24 wherein tungsten oxide material in the first Schottky junction is substantially non-stoichiometric $WO_{3-x}$ and tungsten oxide material in the second Schottky junction is less non-stoichiometric $WO_{3-y}$ where x and y are between 0 and 0.5.

26. The device of claim 24 wherein the plurality of oxygen deficient sites are driven from a vicinity of the first electrode towards the second electrode when a positive voltage is applied to the first electrode, forming an ohmic contact region in a vicinity of the second electrode and a high conductance state for the device.

27. The device of claim 24 further characterized by a low conductance state when a sufficient negative voltage is applied to the first electrode.

28. The device of claim 10 wherein the first electrode further provides for a first interconnect element for a first MOS device and the second electrode further provides for a second interconnect element for a second MOS device.

29. The device of claim 28 wherein the first interconnect element is a tungsten plug.

30. The device of claim 28 wherein the first MOS device is operably connected to the second MOS device or operably disconnected from the second MOS device by adjusting a resistance of the resistive switching device.

31. A method of forming a switching device structure comprising:
providing a semiconductor substrate;
forming a first dielectric material overlying a surface region of the semiconductor substrate;
forming a first electrode structure overlying the first dielectric material, the first electrode structure being formed using a first metal material;
forming a resistive switching element overlying the first electrode structure, the resistive switching element including a metal oxide material characterized by a plurality of oxygen deficient sites; and
forming a second electrode structure overlying the resistive switching element, the second electrode structure being formed from a second metal material.

32. The method of claim 31 wherein the semiconductor substrate is a silicon wafer, a silicon-on-insulator substrate, or a silicon germanium substrate.

33. The method of claim 31 wherein the first dielectric material is silicon oxide formed by thermal oxidation, or deposited by chemical vapor deposition.

34. The method of claim 31 wherein the first electrode structure is tungsten.

35. The method of claim 31 wherein forming the first electrode structure comprises:
depositing the first metal material overlying the first dielectric material;
performing an e-beam or photo-lithography patterning of the first metal material, and
performing a reactive ion etching to form the first electrode structure.

36. The method of claim 31 wherein the first electrode structure comprises at least a portion configured as a nanowire.

37. The method of claim 36 wherein the nanowire has a width ranging from about 10 nm to about 200 nm.

38. The method of claim 31 wherein the metal oxide material is formed by oxidation of the first metal material.

39. The method of claim 31 wherein the metal oxide material is tungsten oxide material formed by oxidation of tungsten material at a temperature of about 400 Degree Celsius.

40. The method of claim 39 wherein the oxidation of the tungsten material is performed using a rapid thermal process (RTP) or a plasma process.

41. The method of claim 39 wherein the tungsten oxide material is characterized by a stoichiometry of $WO_{3-x}$, where x ranges from 0 to 0.5.

42. The method of claim 39 wherein the tungsten oxide material comprises the plurality of oxygen deficient sites, the plurality of oxygen deficient sites form a gradient with a higher density of the plurality of oxygen deficient sites at a surface region of the tungsten oxide material and a lower density of oxygen deficient sites at a tungsten/tungsten oxide interface region.

43. The method of claim 31 wherein the metal oxide material comprises nickel oxide or titanium oxide.

44. The method of claim 31 wherein the metal oxide material is formed by a chemical vapor deposition process or a physical vapor deposition process.

45. The method of claim 31 wherein the second electrode structure comprises at least a portion characterized by a nanowire.

46. The method of claim 31 wherein the first electrode structure and the second electrode structure are spatially configured in an orthogonal manner forming a crossbar structure.

47. The method of claim 31 wherein the resistive switching element is sandwiched between the first electrode structure and the second electrode structure and disposed in an intersecting region of the first electrode structure and the second electrode structure and operably coupled to the first electrode structure and the second electrode structure.

48. The method of claim 31 wherein the plurality of oxygen deficient sites migrate from the second electrode structure towards the first electrode structure when a positive bias voltage is applied to the second electrode structure, increasing a conductance of the metal oxide material, wherein the plurality of oxygen deficient sites migrate from the first electrode structure towards the second electrode structure when a negative bias voltage is applied to the second electrode structure, increasing a resistance of the metal oxide material.

* * * * *